United States Patent
Park et al.

(10) Patent No.: US 8,929,170 B2
(45) Date of Patent: Jan. 6, 2015

(54) MEMORY DEVICE, MEMORY SYSTEM, AND POWER MANAGEMENT METHOD

(71) Applicant: Samsung Electronics Co., Ltd., Suwon-si (KR)

(72) Inventors: Sang-Soo Park, Hwaseong-si (KR); Bong-Soon Lim, Seoul (KR); Hyuk-Jun Yoo, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 148 days.

(21) Appl. No.: 13/773,125

(22) Filed: Feb. 21, 2013

(65) Prior Publication Data

US 2013/0301372 A1  Nov. 14, 2013

(30) Foreign Application Priority Data

May 9, 2012  (KR) .................. 10-2012-0049271

(51) Int. Cl.
G11C 5/14 (2006.01)
G11C 8/04 (2006.01)
G11C 8/06 (2006.01)
G11C 7/22 (2006.01)

(52) U.S. Cl.
CPC .. *G11C 5/14* (2013.01); *G11C 8/04* (2013.01); *G11C 5/144* (2013.01); *G11C 8/06* (2013.01); *G11C 7/22* (2013.01); *G11C 5/148* (2013.01)
USPC .......................... 365/227; 365/194; 365/233.1

(58) Field of Classification Search
CPC .......... G11C 5/14; G11C 5/144; G11C 5/148; G11C 7/22; G11C 7/24; G11C 8/04; G11C 8/06; G11C 8/18
USPC ................. 365/227, 228, 194, 233.1, 233.03, 365/233.04, 233.18, 235
See application file for complete search history.

(56) References Cited

U.S. PATENT DOCUMENTS

| | | | |
|---|---|---|---|
| 7,495,956 B2 | 2/2009 | Fong et al. | |
| 7,554,848 B2 | 6/2009 | Li et al. | |
| 8,289,801 B2 * | 10/2012 | Smith et al. | 365/228 |
| 8,527,693 B2 * | 9/2013 | Flynn et al. | 711/103 |
| 8,595,411 B2 * | 11/2013 | Selinger et al. | 711/103 |
| 8,595,459 B2 * | 11/2013 | Ware et al. | 711/168 |
| 8,745,369 B2 * | 6/2014 | Yurzola et al. | 713/100 |
| 2010/0097864 A1 | 4/2010 | Shibata et al. | |
| 2010/0157683 A1 | 6/2010 | Nguyen | |

(Continued)

FOREIGN PATENT DOCUMENTS

| | | |
|---|---|---|
| JP | 2010-086628 | 4/2010 |
| JP | 2010-287283 | 12/2010 |

(Continued)

*Primary Examiner* — Gene Auduong
(74) *Attorney, Agent, or Firm* — Volentine & Whitt, PLLC

(57) ABSTRACT

A power management method includes receiving a first command with first address indicating a first high power operation that is immediately executed in a first memory die, after receipt of the first command, receiving a second command with a second address indicating a second high power operation, such that an immediate execution of the second high power operation would overlap the first high power operation, and delaying execution of second high power operation through a first waiting period that ends upon completion of the first high power operation, while applying a reference voltage to a second word line of the second memory die indicated by the second address.

20 Claims, 13 Drawing Sheets

(56) References Cited

U.S. PATENT DOCUMENTS

2011/0047356 A2*  2/2011  Flynn et al. .................. 712/220
2011/0161554 A1*  6/2011  Selinger et al. ............... 711/103
2014/0029357 A1*  1/2014  Lee et al. .................. 365/189.11

FOREIGN PATENT DOCUMENTS

| KR | 1020090007054 A | 1/2009 |
| KR | 10-0996040 | 11/2010 |
| KR | 1020110001100 A | 1/2011 |

* cited by examiner

MEMORY DEVICE, MEMORY SYSTEM, AND POWER MANAGEMENT METHOD

CROSS-REFERENCE TO RELATED APPLICATIONS

This application claims the benefit of Korean Patent Application No. 10-2012-0049271 filed on May 9, 2012, the subject matter of which is hereby incorporated by reference.

BACKGROUND

The inventive concept relates generally to memory devices and power management methods for memory devices. More particularly, the inventive concept relates to memory devices and methods of operating memory devices such that less memory cell stress is induced by the application of unnecessary, or unnecessarily long, control voltage(s) (e.g., word line and bit line voltages).

Contemporary memory devices are characterized by large data storage capacities and very high memory cell integration densities. These conditions raise important design considerations, particularly as they relate to power management.

SUMMARY

The inventive concept provides memory devices having improved power management features. In certain aspects of the inventive concept, constituent memory cell stress is reduced by avoiding the application of unnecessary control voltage(s) and/or the application of control voltages having overly long in durations. Power consumption in memory devices according to the inventive concept is better managed than in analogous conventional devices.

According to an aspect of the inventive concept, there is provided a power management method that includes; receiving a first command with first address indicating a first high power operation ($1^{st}$ HPOp) to be executed in the first memory die, and immediately executing the $1^{st}$ HPOp in the first memory die, after receipt of the first command, receiving a second command with a second address indicating a second high power operation ($2^{nd}$ HPOp) to be executed in the second memory die, such that an immediate execution of the $2^{nd}$ HPOp would overlap execution of the $1^{st}$ HPOp, and delaying execution of the $2^{nd}$ HPOp through a first waiting period that ends upon completion of the $1^{st}$ HPOp while applying a reference voltage to a second word line of the second memory die indicated by the second address.

According to an aspect of the inventive concept, there is provided a power management method for a memory system including a memory controller and a memory device, the memory device including a first memory die and a second memory die, the method comprising; communicating from the memory controller a first command with first address indicating a first high power operation ($1^{st}$ HPOp) to be executed in the first memory die, and immediately executing the $1^{st}$ HPOp in the first memory die, after receipt of the first command, communicating from the memory controller a second command with a second address indicating a second high power operation ($2^{nd}$ HPOp) to be executed in the second memory die, such that an immediate execution of the $2^{nd}$ HPOp would overlap execution of the $1^{st}$ HPOp, and delaying execution of the $2^{nd}$ HPOp through a first waiting period that ends upon completion of the $1^{st}$ HPOp while applying a reference voltage to a second word line of the second memory die indicated by the second address, wherein the first command and the second command respectively include a peak control signal that enables the first memory die in relation to execution of a high power operation and disables the second memory die in relation to execution of a high power operation during the first waiting period.

According to an aspect of the inventive concept, there is provided a power management method for a memory system including a memory controller and a memory device, the memory device including a first memory die and a second memory die, the method comprising; communicating from the memory controller a first command with first address indicating a first high power operation ($1^{st}$ HPOp) to be executed in the first memory die, and immediately executing the $1^{st}$ HPOp in the first memory die, after receipt of the first command, communicating from the memory controller a second command with a second address indicating a second high power operation ($2^{nd}$ HPOp) to be executed in the second memory die, such that an immediate execution of the $2^{nd}$ HPOp would overlap execution of the $1^{st}$ HPOp, and delaying execution of the $2^{nd}$ HPOp through a first waiting period that ends upon completion of the $1^{st}$ HPOp while applying a conditioning voltage to a second word line of the second memory die indicated by the second address.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

The inventive concept now will be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to one of ordinary skill in the art.

The terminology used herein is for the purpose of describing particular embodiments only and is not intended to be limiting of exemplary embodiments of the inventive concept. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of exemplary embodiments.

Exemplary embodiments are described herein with reference to cross-sectional illustrations that are schematic illustrations of exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing.

Figure 1:
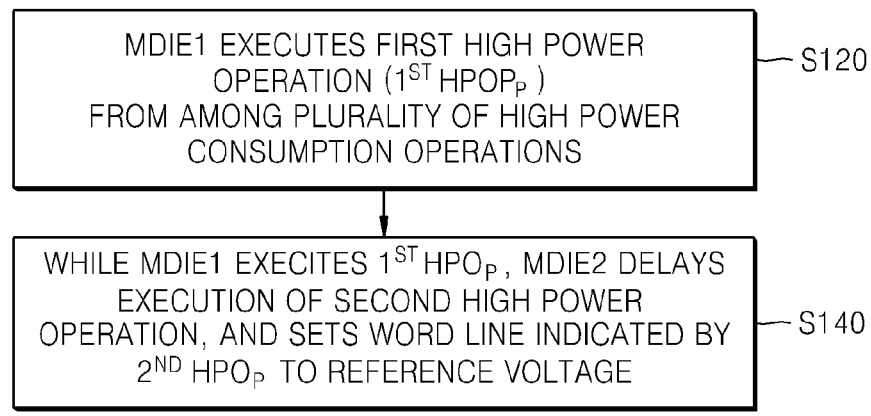
FIG. 1 is a flowchart generally summarizing a method of managing power in a memory device according to an embodiment of the inventive concept.
Figure 2:
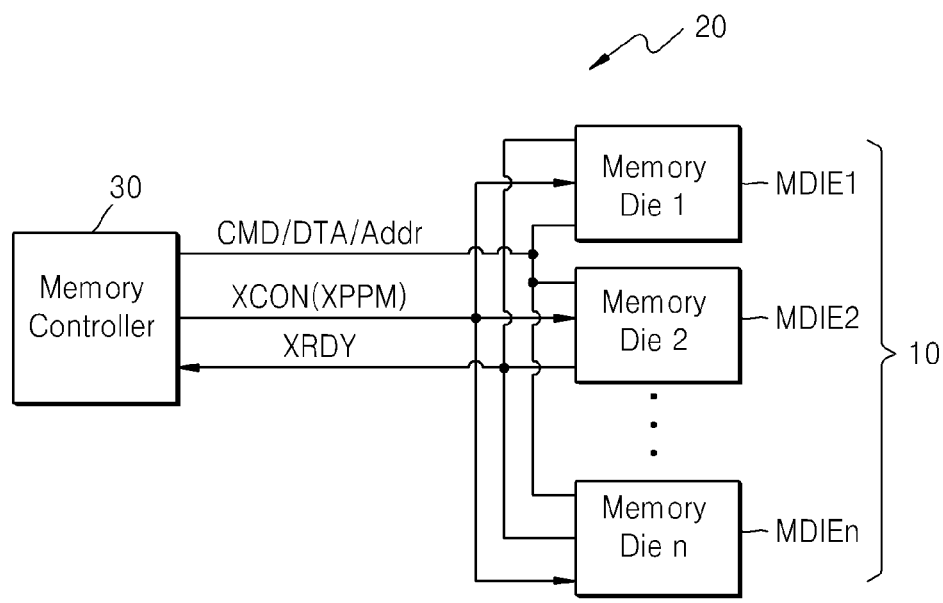
FIG. 2 is a block diagram further illustrating in one example a memory device according to an embodiment of the inventive concept.

FIG. 1 is a flowchart generally summarizing one power management method for a memory device according to an embodiment of the inventive concept. FIG. 2 is a block diagram illustrates one example of a memory device 10 in a memory system 20 that may operate according to the method of FIG. 1.

Referring collectively to FIGS. 1 and 2, the memory system 20 generally comprises the memory device 10, including a plurality of memory dies (MDIE1 through MDIEn controlled by a memory controller 30. In operation, the memory controller 30 controls various functional operations being respectively executed by the MDIE such that certain high power operations are not simultaneously performed (i.e., do not overlap in temporal execution). The conceptual distinction between "high power operations" and "low power operations"—as executed by the memory dies—is a one based on relative power consumption. Selected examples of both high power operations and low power operations will be given hereafter, but those skilled in the art will understand the general distinction and will further understand that such high/low distinction may be made in relation to other systems parameters (e.g., expected battery life, number of memory dies, etc.). The execution management of designated high power operations may be made between each and every one of the memory dies, or between a certain limited number of the memory dies simultaneously executing high power operations.

That is, in the memory device 10 including the MDIE, a power management method may include; a first memory die (e.g., MDIE1) from among the plurality of memory dies (MDIE) executes a first high power operation (S120), while the first memory die is executing the first high power operation, a second memory die (e.g., MDIE2) delays execution of a second high power operation, and sets a "selected word line" indicated by a memory cell page of the second high power operation to a reference voltage (S140).

In general, high power operations generate a "peak current" over some "peak current period" of time. When two (2) or more peak currents related to two (2) or more high current operations executed by one or more memory die(s) in a memory device may "overlap" (i.e., simultaneously occur in whole or in part). The compound effect of overlapping peak currents may cause the memory device to exceed its "maximum power consumption level". Under such conditions, the memory system or constituent memory device may malfunction. Hence, it is necessary to control the execution timing of high power operations.

In certain embodiments of the inventive concept, the memory controller 30 may be used to temporally control (or temporally sequence) the execution of high power operations by the memory dies of the memory device 10. In addition to this proper sequencing of high power operations, the memory system 20 under the control of the memory controller 30 may better optimize overall performance by carefully preparing memory dies conditions while delaying the execution of a later occurring high power operation.

Peak power management may be performed not only by using the memory controller 30, but also by each of the memory dies. For example, each of the memory dies may avoid overlapping peak current operations with a certain number of other memory dies (i.e., not exceeding an allowable number of other memory dies) by referencing an internal clock common to all of the memory dies and generated in response to a system clock (e.g.,) provided by the controller 30. That is, the execution of certain high power operations and/or the delay of other high power operations may be performed within a collection of memory dies synchronously with the internal clock.

However, for purposes of the detailed embodiments that follow, it is assumed that peak power management is controlled using a memory controller, like the memory controller 30 in FIG. 2.

In the embodiment illustrated in FIG. 2, the memory controller 30 controls peak power management using a peak control signal (XPPM). It is assumed, for example, that the memory dies of the memory device 10 may be operationally distinguished according to respective identifiers. Hence, the peak control signal may include memory die identifier information related to which memory die of the memory device 10 intending to perform a high power operation is currently "enabled" (i.e., is currently allowed to execute the high power operation), and which memory dies of the memory device 10 intending to simultaneously perform a high power operation are "disabled" (i.e., are not currently allowed to execute a high power operation).

The peak control signal (XPPM) may be included in a bundle of one or more control signals (XCON) communicated from the memory controller 30 to the memory device 10. In certain embodiments, the peak control signal may be provided using (or be generated on the basis of) an existing ready signal (XRDY) regularly communicated from the memory controller 30 to the memory dies. Those skilled in the art, for example, will understand that a ready signal may be communicated to the memory dies during read/write operations from the memory controller CTRL. During read/write operations, the memory controller CTRL may also communicate command (CMD), data (DTA), and an address (Addr) information to the memory dies in conjunction with the ready signal. The command information may include (e.g.,) information defining voltage level(s) for certain control signals applied in at least one of the memory dies.

Although the CMD/DTA/Addr information are shown in FIG. 2 as being communicated via a common signal line or bus, those skilled in the art will understand that separate signal lines or buses may be used. It will also be understood that the memory system 20 of FIG. 2 may include more than one memory devices 10.

As noted above, it is assumed that the memory dies of the memory device 10 each receive the control signal(s) (XCON) including the peak control signal (XPPM). When the identifier for a particular memory die (e.g., MDIE1) is present in the peal control signal, the corresponding memory die(s) is(are) enabled and may perform a high power operation capable of generating a peak current. In contrast, when the identifiers for other memory dies (e.g., MDIE2 and MDIE3) are absent from the peak control signal, the corresponding memory dies are disabled (or not-enabled) and may not perform a pending high power operation until an established delay period expires or a delay condition is removed. Thus, the operation of certain disabled memory dies may be suspended during established delay periods or under established delay conditions when the next operation to be executed by the disabled memory dies is designated as a high power operation. Yet, disabled memory dies may execute a next operation, so long as it is designated as a low power operation.

In certain embodiments of the inventive concept, the memory device 10 may be a nonvolatile memory device, such as a NAND flash memory device. Peak power management for a NAND flash memory device will be described hereafter in some additional detail.

Figure 3:
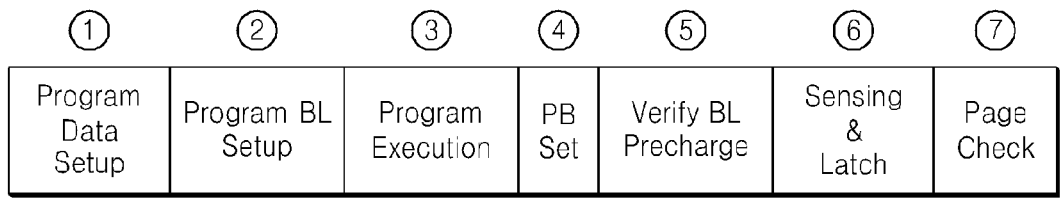
FIG. 3 is a conceptual diagram illustrating certain sub-operations for a program operation performed by each memory die of FIG. 2.

FIG. 3 is a conceptual diagram illustrating various sub-operations of a program operation that may be performed by a plurality memory dies. Assuming the constituent memory device is a NAND flash memory device, well understood erase, program, verify, and read operations may be performed to program data to and read data from selected memory cells in a NAND flash memory cell array, including memory dies MDIE1 through MDIEn. In particular, the program operation illustrated in FIG. 3 comprises; a program data setup sub-operation ①, a program bit line setup sub-operation ②, a program execution sub-operation ③, a page buffer setting sub-operation ④, a verification bit line precharge sub-operation ⑤, sensing and latching sub-operation ⑥, and a page checking sub-operation ⑥. Those skilled in the art understand that execution of the program operation may involve repeated execution of certain sub-operations or sequences of sub-operations.

Figure 4:
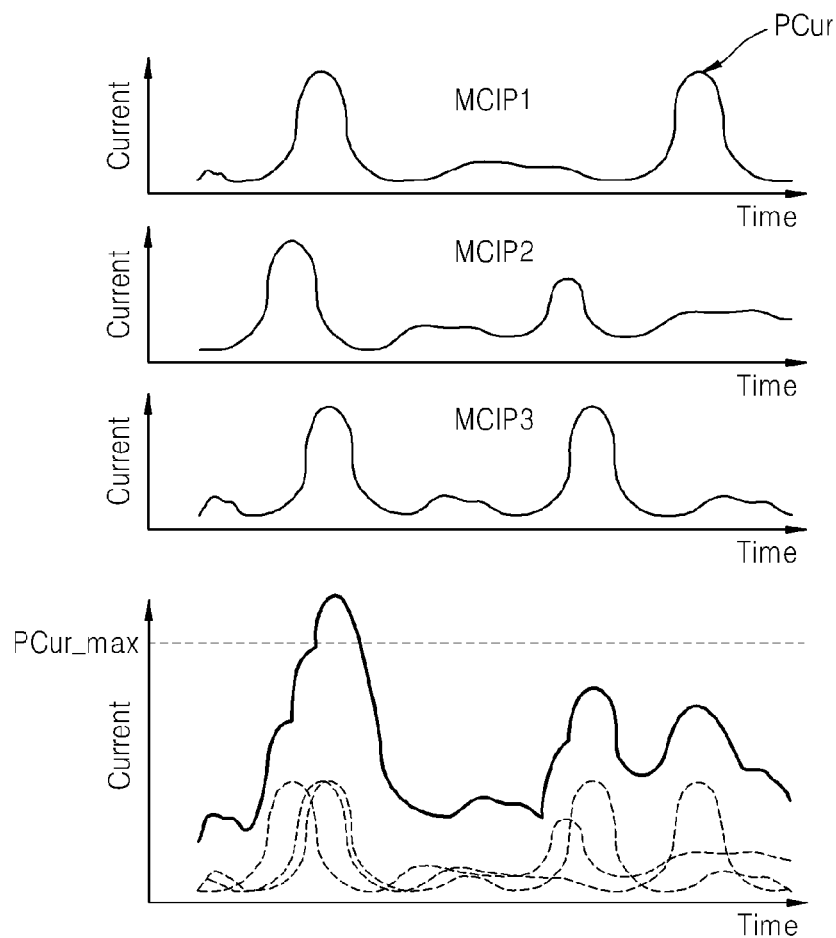
FIG. 4 is a set of graphs illustrating one case wherein peak currents overlap each other in a conventional memory system or memory device.

FIG. 4 is a set of graphs illustrating a case wherein peak currents overlap in a memory system including multiple memory devices. Referring to FIG. 4, it is assumed that the program operation of FIG. 3 is (substantially) simultaneously executed by multiple memory dies (e.g., MDIE1, MDIE2 and MDIE3). It is further assumed that a demand a peak current (PCur) is associated with one or more of the sub-operations constituting the program operation. For example, respective peak currents (PCur) may be generated by each memory dies during the program bit line setup sub-operation ② and during the verification bit line precharge sub-operation ⑤.

The final (bottom) graph of FIG. 4 illustrates a composite (or combined) current being generated by all activated memory dies in the memory system. As can be seen, when multiple the peak currents overlap, a resulting "composite peak current" is generated that exceeds a maximum peak current rating (PCur_Max) for the memory system and/or memory device. This event may result in catastrophic memory device failure.

Figure 5:
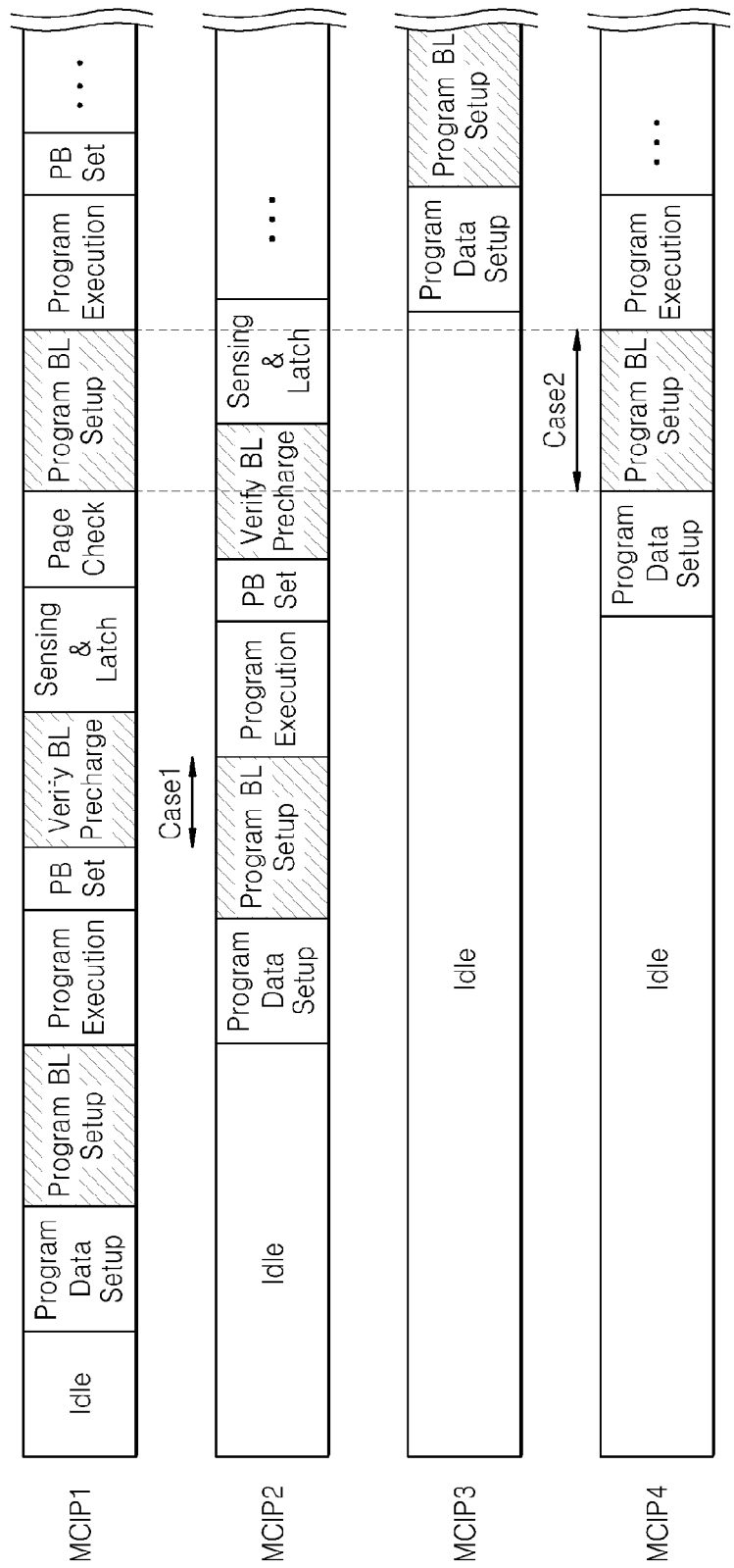
FIG. 5 is a set of functional timing diagrams that collectively illustrate a case wherein certain peak currents overlap during the conventional operation of multiple memory devices.

FIG. 5 is a conceptual diagram illustrating a case wherein peak currents overlap during the respective operation of multiple memory dies in a memory device. Referring to FIG. 5, it is assumed that four (4) memory dies (MDIE1, MDIE2, MDIE3 and MDIE4) are at least partially activated during a given period. The respective nature of each activation is indicated by a corresponding instruction set execution sequence (e.g., MCIP1 through MCIP4). Finally, it is again assumed that a peak current (PCur) is demanded during both the program bit line setup sub-operation ② and the verification bit line precharge sub-operation ⑤.

As a result, while the second memory die MDIE2 is executing a program bit line setup operation ②, the first memory die MDIE1 executes a verification bit line sub-precharge operation ⑤ in at least a partially overlapping manner (Case 1). Likewise, the first memory die MDIE1 and fourth memory die MDIE4 execute a program bit line setup sub-operation ②, while the second memory die MDIE2 executes a verification bit line sub-precharge operation ⑤ (Case2).

During at least the exemplary Case 1 and Case 2 conditions, very high composite peak current will be generated in the memory device. Depending on the rating, the power supply of the memory system or memory device may be unable to provide the power demanded by the composite peak current. Accordingly, the reliability of the memory system may become unacceptable. In order to safeguard the reliability of the memory system it is necessary to either (1) provide a power supply having a greater composite peak current power capacity, or (2) prevented the composite peak current from exceeding an established limit. The first option is costly, but embodiments of the inventive concept readily accomplish the second option.

Figure 6:
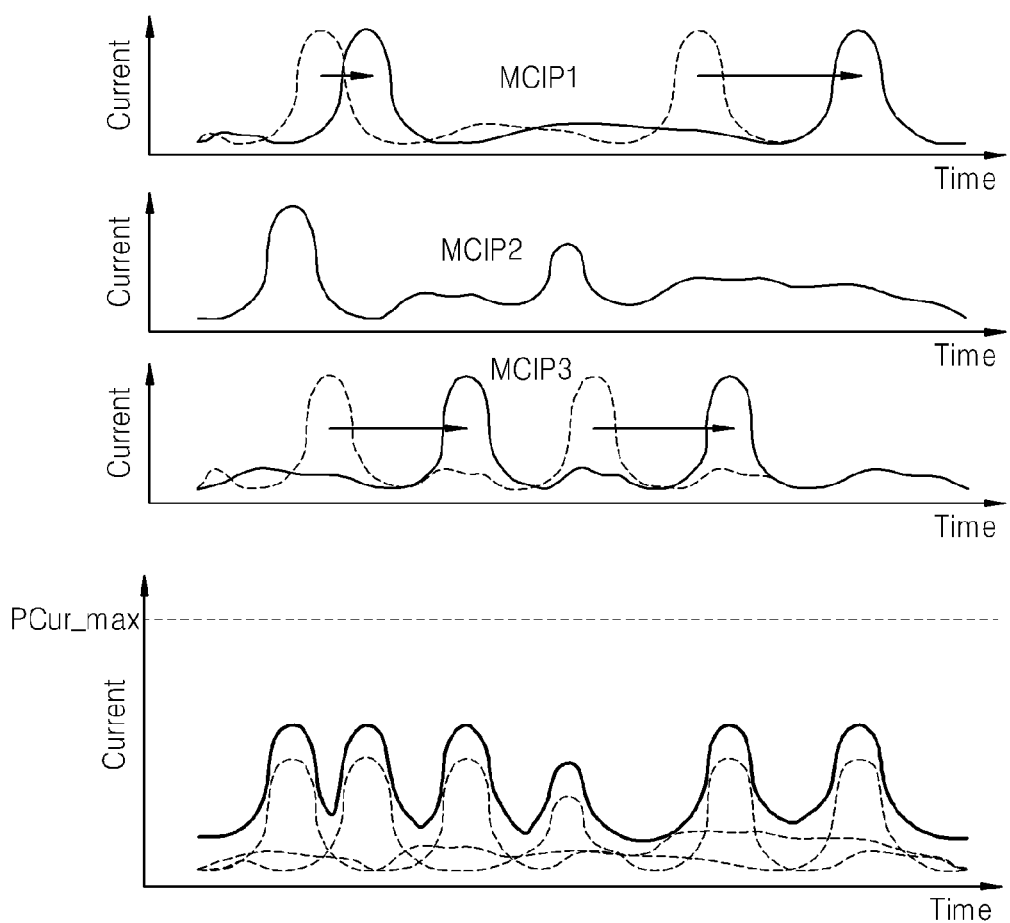
FIG. 6 is a set of graphs illustrating one method of managing peak current in a memory system according to an embodiment of the inventive concept.

FIG. 6 is a set of graphs illustrating one method of controlling the operation of a memory device including multiple memory dies, such that the composite peak current for the memory device remains below an established maximum peak current rating (PCur_max) in accordance with certain embodiments of the inventive concept. Referring to FIG. 6, while a peak current is being generated by one memory die (e.g., by the second memory die MDIE2), pending high power operations potentially generating another peak current in another memory die (e.g., the first memory die MDIE1 and subsequently the third memory die MDIE3) are delayed. This result is indicated in FIG. 6 by arrows. By staggering respective peak currents potentially generated in multiple memory dies, a much lower composite peak current is ensured, thereby respecting the established maximum peak current rating.

Figure 7:
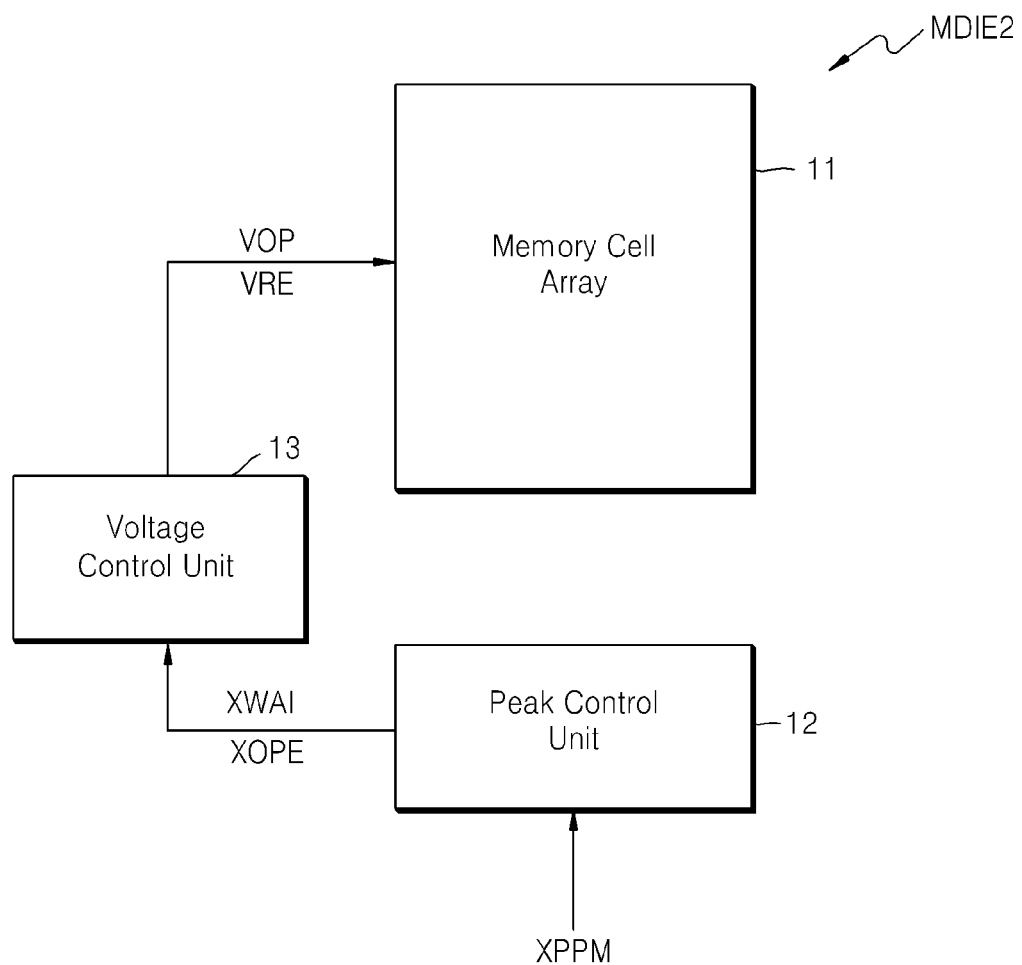
FIG. 7 is a block diagram further illustrating the second memory die of FIG. 2.

FIG. 7 is a block diagram further illustrating the second memory die MDIE2 of FIG. 2 in relation to one power management method according to an embodiment of the inventive concept.

Referring to FIGS. 2 and 7, the second memory die MDIE2 included in the memory device 10 includes a memory cell array 11 and a peak control unit 12. The peak control unit 12 may be used to generate a delay (or waiting) signal (XWAI) such that a selected word line has a reference voltage (VRE) during a commensurate waiting period in response to a peak control signal (XPPM) received from the memory controller 30. The selected word line, which is a word line corresponding to a page of memory cells in the second memory die MDIE2 that is indicated by a high power operation to be executed by the second memory die MDIE2 following the waiting period. For example, a selected word line may be indicated by the command (CMD) and/or address (Addr) corresponding to the "waiting" high power operation.

In response to the peak control signal XPPM, the peak control unit 12 may be used to generate an operation signal (XOPE) at the end of a waiting period. In response to the operation signal (XOPE), the voltage control unit 13 may be used to generate one or more appropriate operation voltage(s) (VOP) (e.g., control voltage(s)) that will be applied to a selected word line and/or a selected bit line during the high power operation.

An exemplary waiting period and high power operation for a memory die will be explained in some additional detail with reference to FIG. 10.

The waiting signal (XWAI) and operation signal (XOPE) may be internally generated by the peak control unit 12 located in the memory device 10 or within each constituent memory die MDIE. Alternately, the waiting signal (XWAI) and operation signal (XOPE) may be generated by the memory controller 30 of FIG. 2 and communicated to the memory device 10 or each constituent memory die MDIE. In the latter case, the waiting signal (XWAI) and operation signal (XOPE) may part of the control signals (XCON) generally communicated from the memory controller 30.

Figure 8A:
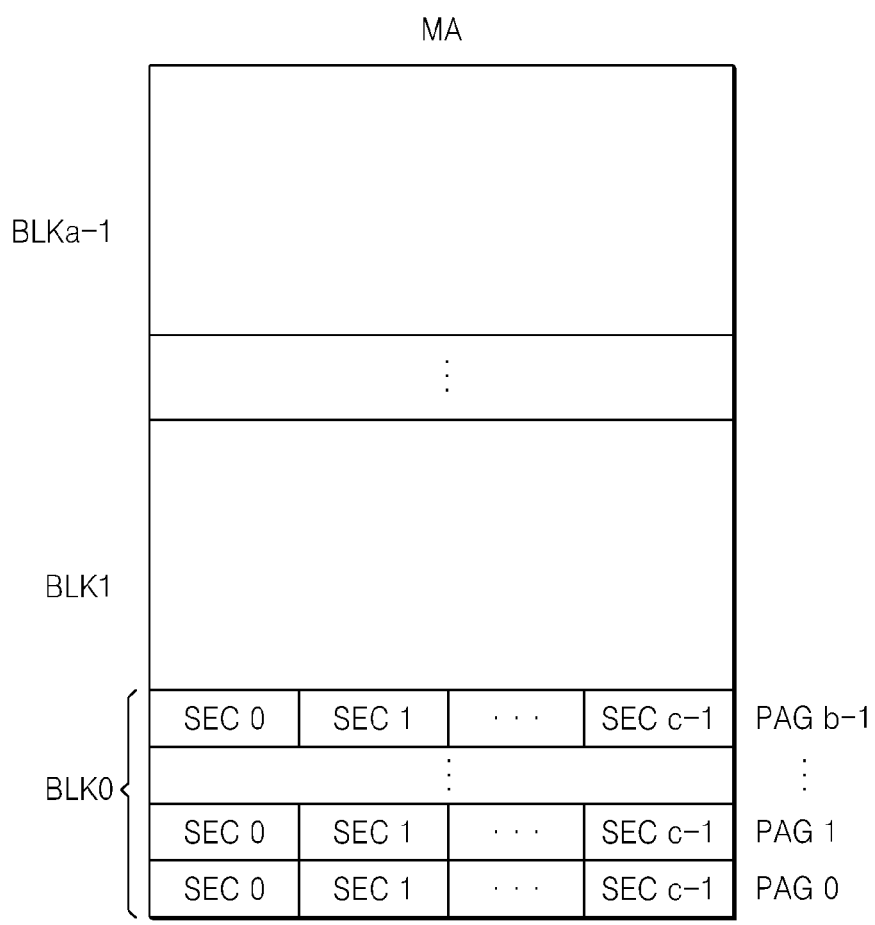
FIGS. 8A and 8B are diagrams further illustrating the memory cell array of FIG. 7.
Figure 8B:
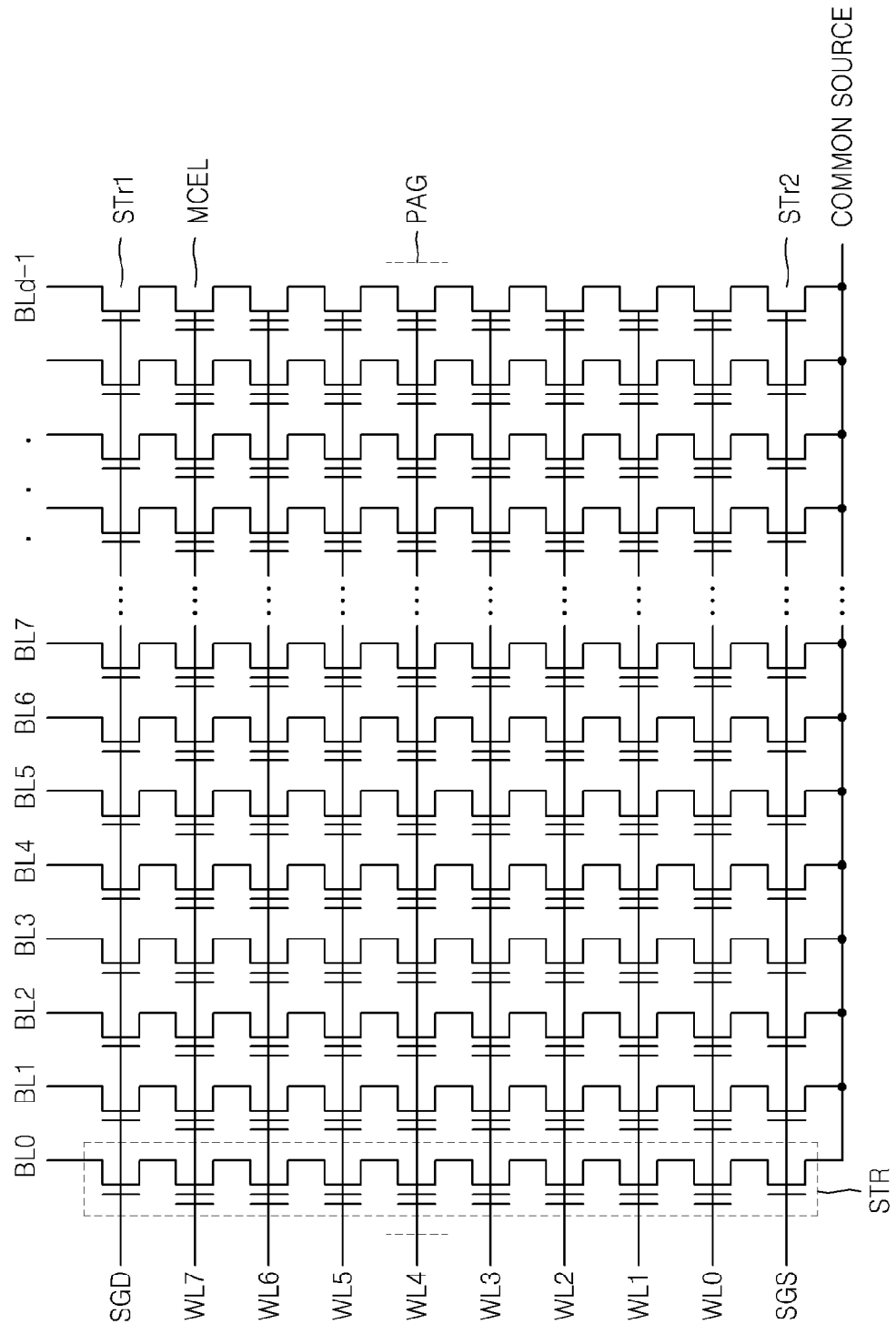

FIGS. 8A and 8B are diagrams further illustrating one possible example of the memory cell array 11 of FIG. 7.

Referring to FIG. 8A, the memory cell array 11 may include multiple blocks BLK0 through BLKa-1, wherein each of the blocks BLK0 through BLKa-1 may include pages PAG0 through PAGb-1. Each of the pages PAG0 through PAGb-1 may include sectors SEC0 through SECc-1. Here, variable 'a', 'b', and 'c' are each non-zero integers.

For convenience, although the pages PAG0 through PAGb-1 and the sectors SEC0 through SECc-1 of only the block BLK0 are illustrated in FIG. 8A, the other blocks BLK1 through BLKa-1 have the same structure as the block BLK0.

When the memory cell array 11 is a memory cell array of a NAND flash memory device, each of the blocks BLK0 through BLKa-1 of FIG. 8A may be configured as shown in FIG. 8B. Referring to FIG. 8B, each of the blocks BLK0 through BLKa-1 may include d (d is an integer equal to or greater than 2) strings STR to which 8 memory cells MCEL are serially connected in a direction of bit lines BL0 through BLd-1. Each of the strings STR may also include a drain selection transistor Str1 and a source selection transistor Str2 which are connected to both ends of the memory cells MCEL that are serially connected.

In the NAND flash memory device configured as shown in FIG. 8B, an erase operation is performed in units of blocks and a program operation is performed in units of pages PAG respectively corresponding to word lines WL0 through WL7. Although one block includes 8 pages PAG corresponding to 8 word lines WL0 through WL7 in FIG. 8B, each of the blocks BLK0 through BLKa-1 of the memory cell array 11 may include memory cells and pages whose number is different from the number of the memory cells MCEL and the pages PAG of FIG. 8B. Also, if the memory device MDEV is a flash memory, the memory device MDEV may include a plurality of memory cell arrays each of which has the same structure and performs the same operation as the memory cell array 11.

Figure 9A:
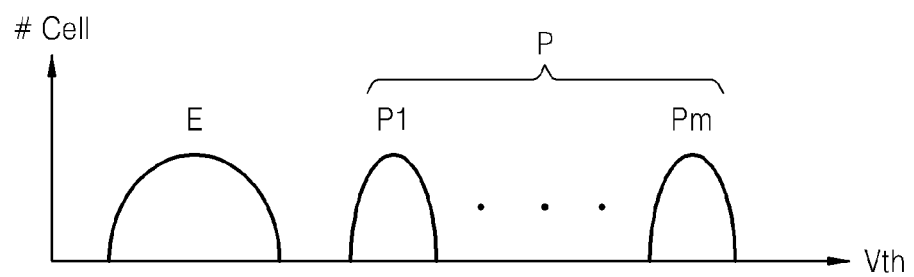
FIGS. 9A and 9B are graphs illustrating threshold voltage distributions for the memory cells of the memory cell array of FIG. 8B.
Figure 9B:
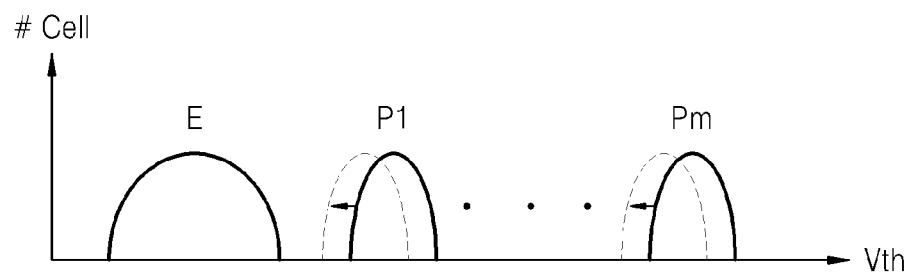

FIGS. 9A and 9B are graphs illustrating threshold voltage distributions for the memory cells MCEL of FIG. 8B.

Referring to FIGS. 8B and 9A, each of the memory cells MCEL may be set to be programmed to have one state from among an erase state E and one or more program states P1 through Pm (collectively denoted by P). The program state P corresponds to the number of bits of data programmed in one memory cell.

For example, in the case of a single-level cell (SLC) flash memory device, each of the memory cells MCEL of the memory cell array 11 of FIG. 8B has a threshold value included in one state from among the erase state E and the one program states P according to a value of programmed data. Alternatively, in the case of a 2-bit multi-level cell (MLC) flash memory device, each of the memory cells MCEL has a threshold voltage included in one state from among the erase state E and three program states P. Alternatively, in the case of a 3-bit MLC flash memory, each of the memory cells MCEL has a threshold voltage included in one state from among the erase state E and seven program states P.

Referring to FIG. 9A, when a voltage is continuously applied to the memory cell MCEL, that is, when a stress is continuously applied to the memory cell MCEL, a read disturb error 11y occur so that a threshold voltage is gradually reduced as shown in FIG. 9B. Accordingly, in order to prevent occurrence of a read disturb error, the memory die MDIE may be designed to control the number of times an erase operation is performed or a program operation is performed in the memory cell MCEL.

Furthermore, according to a method of managing power in a memory device according to an embodiment of the inventive concept, a read disturb error may be more efficiently prevented by reducing the voltage level applied to a memory cell MCEL during a waiting period initiated as the result of a peak current power management. This further refinement of certain methods of managing power in a memory device according to embodiments of the inventive concept will be explained in some additional detail.

Figure 10:
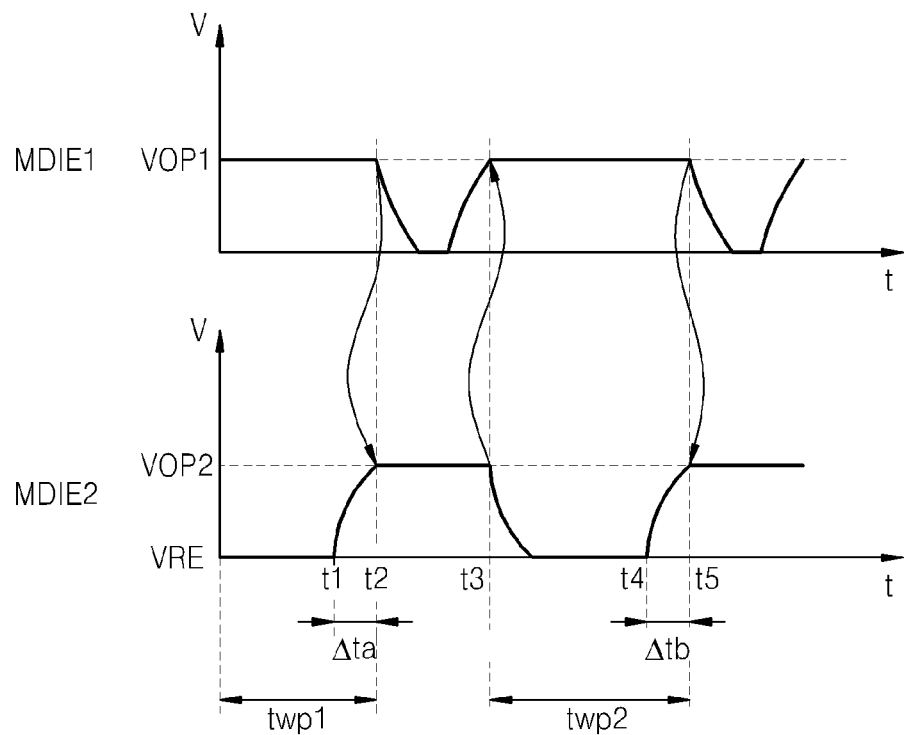
FIGS. 10, 11, 12 and 14 illustrate various voltage waveforms associated with certain embodiments of the inventive concept.

FIG. 10 is a set of graphs further illustrating one possible power management method according to certain embodiments of the inventive concept.

Referring collectively to FIGS. 1, 2, and 10, up to time (t2) it is assumed that a first memory die MDIE1 is activated and executing a first high power operation that applies a first control voltage (VOP1) to a first selected word line, and generates a peak current (S120). For example, the first high power operation may be a program bit line setup operation, or a read bit line setup operation.

It is further assumed that a second memory die MDIE2 is in a waiting (or idle) state extending through a first waiting period (twp1) that ends at time (t2). However, during the first waiting period at a time (t1) before time (t2), the second memory die MDIE2 "sets-up" a second selected word line of the second memory die MDIE2 by applying a reference voltage (VRE) (S140). The reference voltage (VRE) may have a level that is lower than the level of a second control voltage (VOP2) to be applied to the second word line during a second high power operation.

In the foregoing the "first selected word line" is a word line coupled to memory cells of the first memory die MDIE1 being acted upon by the first high power operation as indicated by a command (CMD) and/or address (Addr) associated with the first high power operation. The "second selected word line" is another word line coupled to memory cells of the second memory dies MDIE2 being acted upon by the second high power operation as indicated by a command (CMD) and/or address (Addr) associated with the second high power operation.

Between time (t1) and time (t2), (t2) being the end of the first high power operation and the end of the first waiting period (twp1), the second memory die MDIE2 increases the level of the control voltage applied to the second selected word line from the reference voltage (VRE) to a second control voltage (VOP2). This period between (t1) and (t2) may be understood as a "memory die condition preparation period" ($\Delta$ta). In the example illustrated in FIG. 10, a selected word line is fully biased during the second memory die condition preparation period, but this is just one example of many possible preparations that may be performed singularly or in combination. For example, ECC circuitry may be enabled, register data may be interrogated, a power supply may be enabled, etc.

However, in the example illustrated in FIG. 10, the duration of the memory die condition preparation period ($\Delta$ta) may be defined in accordance with an expected time required for the second word line to become fully pre-charged from the reference voltage (VRE) to the second control voltage (VOP2).

In certain embodiments, the level of the reference voltage (VRE) may selected to be the same as a voltage applied to other word lines (e.g., non-selected word lines) in the block including the second word line to which the second control voltage (VOP2) will be applied. For example, when the second selected word line is assumed to be word line WL4 of FIG. 8B, the other word lines (WL0 through WL3 and WL5 through WL7) will be non-selected word lines having a non-selected word lien voltage applied during (e.g.,) a program operation or a read operation.

Figure 11:
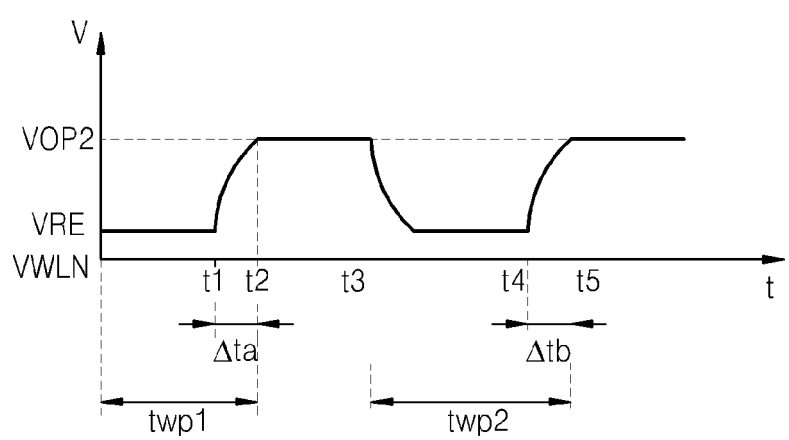

FIG. 11 illustrates another example in which the reference voltage (VRE) is defined to have a level somewhere between the second control voltage (VOP2) and a non-selected word line voltage (VWLN).

In certain embodiments, the level of the applied reference voltage VRE will be determined in view of (e.g.,) a desired duration for the memory die condition preparation period ($\Delta$ta) and a desired stress level for the memory cells of the second memory die MDIE2 receiving the reference voltage (VRE). For example, when a read disturb error is of more concern than reduction in operating speed for the memory device 10, the level of the reference voltage (VRE) may be set closer to (or equal to) the level of the non-selected word line voltage (VWLN). In contrast, when an increase in operating speed for the memory device 10 takes priority over the relative stress applied to memory cells, the level of the reference voltage (VRE) may be set closer to (or equal to) the level of the second control voltage (VOP2).

Returning to FIG. 10, when the first waiting period (twp1) for the second memory die MDIE2 ends at the time (t2), the second memory die MDIE2 may begin execution of the second high power operation capable of generating a peak current. Upon completion of the second high power operation at time (t3), the first memory die MDIE1 may again be enabled to execute a high power operation while the second memory die MDIE2 is again disabled and enters a second waiting period (twp2).

This exclusive enablement/disablement approach as between memory dies in a memory device may continue as shown in FIG. 10. However, the enablement/disablement condition may only be applicable to competing memory die demands for peak current. Thus, low power operations may executed regardless of high power operation enablement/disablement conditions and control signals. Further, different memory die condition preparation periods ($\Delta$ta) respectively associated with different high power operations may be defined, whereas FIG. 10 show only a same duration memory die condition preparation period.

Figure 12:
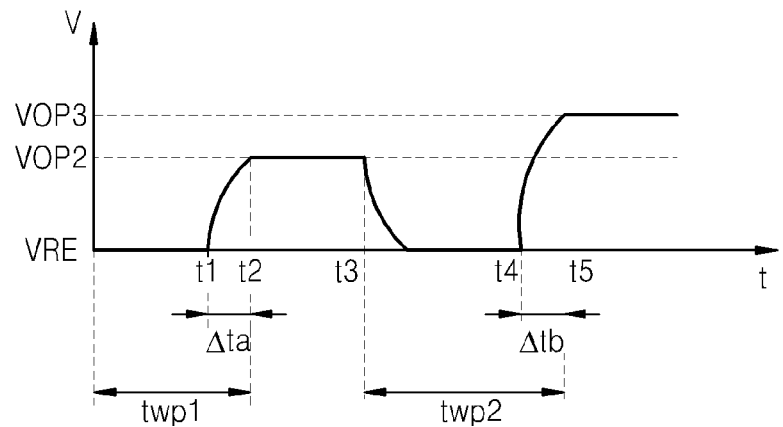

Further still, the level of the first control voltage (VOP1) and the level of the second control voltage (VOP2) are shown in FIG. 10 as being substantially the same. This need not always be the case, as each high power operation may demand the application of one or more control voltages having respective level(s). For example, in FIG. 12, application of a second control voltage (VOP2) is followed by application of a third control voltage (VOP3) having a relatively higher level.

Figure 13:
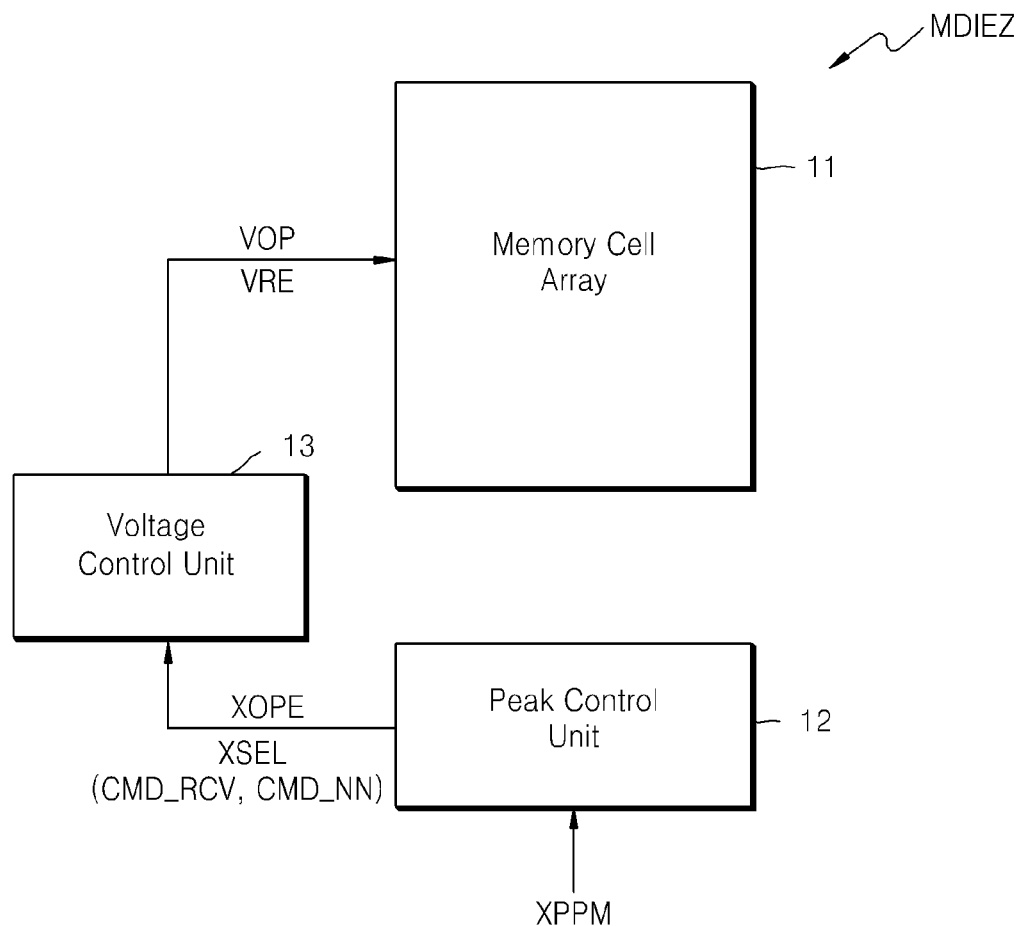
FIG. 13 is a block diagram further illustrating control signal inter-operation in certain embodiments of the inventive concept.
Figure 14:
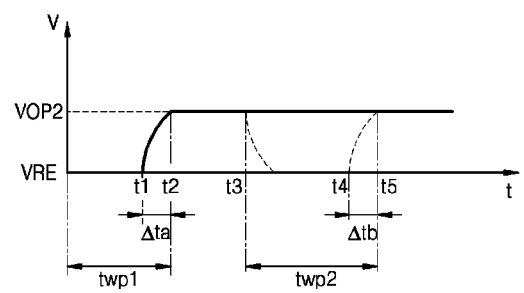

FIG. 13 is another block diagram, like the one shown in FIG. 7, further illustrating the second memory die MDIE2 of FIG. 2 in relation to another power management method according to an embodiment of the inventive concept. FIG. 14 is a graph further illustrating the power management method of FIG. 13.

Referring to FIGS. 10, 13, and 14, the peak control unit 12 of the second memory die MDIE2 may be used to generate a selection signal (XSEL) indicating that a selected word line should receive the reference voltage (VRE) during a waiting period. Alternately, the control signal (XCON) provide by a memory controller may be used to control this function.

For example, the selection signal (XSEL) may have a first value indicating that the selected word line will receive the reference voltage (VRE) during a waiting period (e.g., XSEL=CMD_RCV), or the selection signal (XSEL) may have a second value (e.g., XSEL=CMD_NN) indicating that the selected word line will not receive the reference voltage (VRE) but instead will continue to receive the second control voltage (VOP2) during a waiting period.

As such, a determination of whether or not to change the voltage of the selected word line to the reference voltage (VRE) during a waiting period may be made upon consideration of a desired operating speed for the memory device 10 or memory system 20, acceptable memory cell stress, tolerable length of the waiting period, etc. In this context, the choice between the reference voltage and a control voltage used in a high power operation may be viewed a choosing a conditioning voltage for (e.g.,) the indicated word line.

The foregoing technical description is drawn to the exemplary second memory die MDIE2, but those skilled in the art will recognize that all of the memory dies (MDIE) of the memory device 10 in the memory system 20 of FIG. 2 may be similarly operated.

Using the foregoing circuits, signals and methods, according to various embodiments of the inventive concept, read disturb errors may be reduced or prevented by reducing the level of a voltage applied to respective word lines and connected memory cells during in waiting period(s). Furthermore, an operating environment for the memory device 10 and/or memory system 20 may be better optimized.

Figure 15:
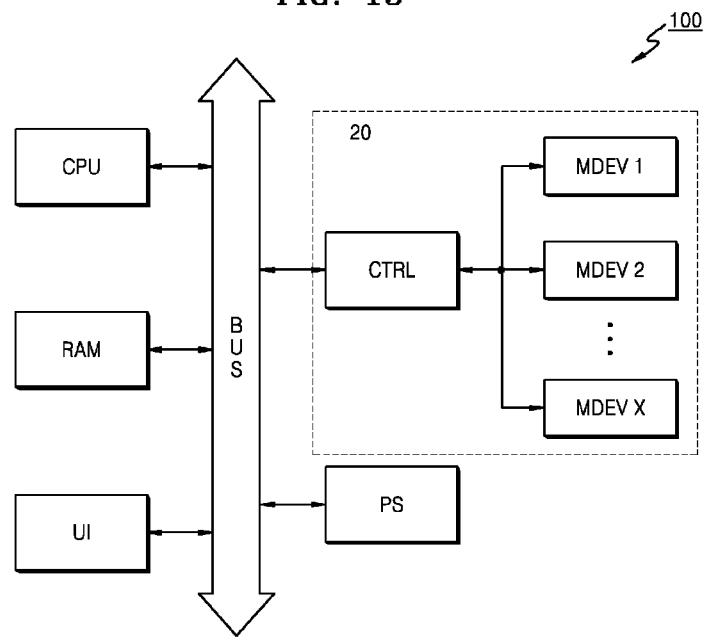
FIG. 15 is a block diagram illustrating a computing system according to an embodiment of the inventive concept.

FIG. 15 is a block diagram illustrating a computing system 100 according to an embodiment of the inventive concept.

The computing system 100 includes a Central Processing Unit (CPU), a user interface (UI), and the memory system 20 electrically connected via a bus (BUS). The memory system 20 may be configured like the embodiment described above in relation to FIG. 2.

In certain embodiments, the computing system 100 may further include a power supply device (PS) e.g., a battery. When the computing system 100 is a mobile device, it may further include one or more modems such as a baseband chipset and a battery for supplying an operation voltage. Also, it will be understood by one of ordinary skill in the art that the computing system 100 may be further provided with an application chipset, a camera image processor, and a mobile DRAM, and thus a detailed explanation thereof will not be given.

Figure 16:
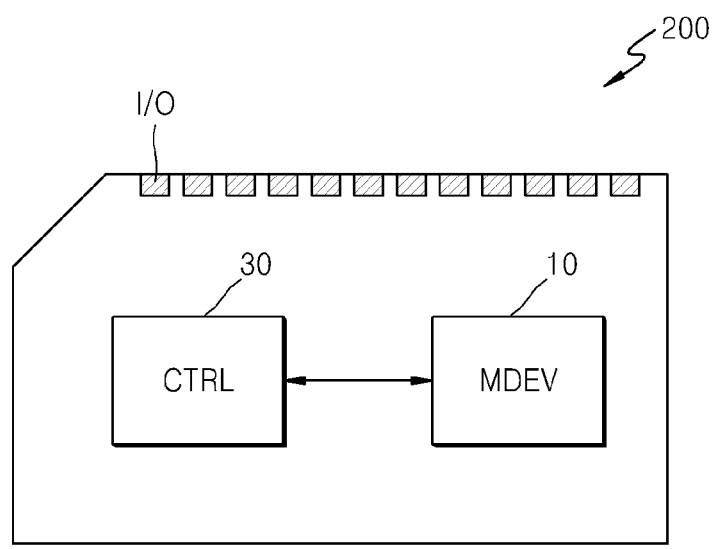
FIG. 16 is a block diagram illustrating a memory card according to an embodiment of the inventive concept.

FIG. 16 is a block diagram illustrating a memory card 200 according to an embodiment of the inventive concept.

Referring to FIG. 16, the memory card 200 includes the memory controller 30 and the memory device 10 previously described in relation to FIG. 2. The memory controller 30 generally controls the reading of data from and the writing of data to memory device 10 at the request of an external host (not shown) connected via an input/output (I/O) unit. The memory card 200 of FIG. 16 may be a compact flash card (CFC), a micro-drive, a smart media card (SMC), a multimedia card (MMC), a security digital card (SDC), a memory stick, or a USB flash memory driver.

Figure 17:
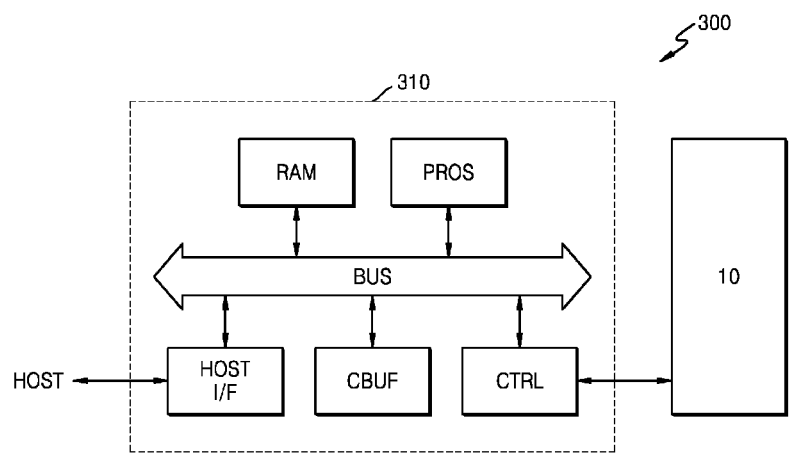
FIG. 17 is a block diagram illustrating a solid-state drive (SSD) according to an embodiment of the inventive concept.

FIG. 17 is a block diagram illustrating a solid-state drive (SSD) 300 according to an embodiment of the inventive concept.

Referring to FIG. 17, the SSD 300 includes an SSD controller 310 and the memory device 10 like the one (e.g.,) previous described in relation to FIG. 2. The SSD controller 310 include a processor (PROS), a Random Access Memory (RAM), a cache buffer (CBUF), and the memory controller (CTRL) connected via a bus (BUS). The processor controls the memory controller CTRL to communicate data to or receive data from the memory device 10 in response to requests (e.g., a command, an address, or data) received from a host (not shown). The processor and the memory controller of the SSD 300 may constitute a single ARM processor. Data needed to operate the processor may be stored in the RAM.

A host interface (HOST I/F) may receive a request from the host and transmit the request to the processor, or transmit data received from the memory device 10 to the host. The host interface may interface with the host via any of various interface protocols such as universal serial bus (USB), man machine communication (MMC), peripheral component interconnect-express (PCI-E), serial advanced technology attachment (SATA), parallel advanced technology attachment (PATA), small computer system interface (SCSI), enhanced small device interface (ESDI), and intelligent drive electronics (IDE). Data to be communicated to the memory device 10 or received from the memory device 10 may be temporarily stored in the cache buffer. The cache buffer may be implemented with static random access memory (SRAM).

Figure 18:
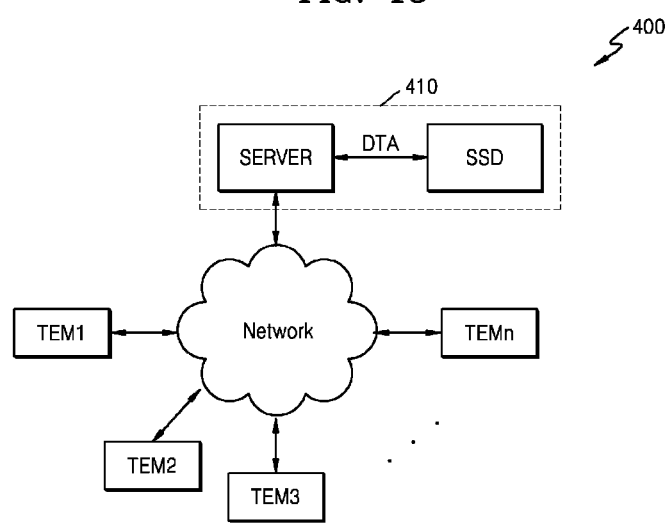
FIG. 18 is a block diagram illustrating a network system that includes a server system including an SSD according to an embodiment of the inventive concept.

FIG. 18 is a block diagram illustrating a network system 400 that includes a server system 410 including an SSD like the one previously described in relation to FIG. 17 according to an embodiment of the inventive concept.

Referring to FIG. 18, the network system 400 may include the server system 410 and a plurality of terminals TEM1 through TEMn connected via a network. The server system 410 of FIG. 18 may include a server (SERVER) that processes requests received from the plurality of terminals TEM1 through TEMn and a SSD that stores data.

According to various embodiments of the inventive concept, memory devices and related power management methods provide for a marked reduction in the stress applied to constituent memory cells due to the over long application or completely unnecessary application of high voltage control signals. Hence, the reliability of the memory device and a memory system including the same may be improved.

While the inventive concept has been particularly shown and described with reference to exemplary embodiments thereof using specific terms, the embodiments and terms have been used to explain the inventive concept and should not be construed as limiting the scope of the inventive concept defined by the claims. The exemplary embodiments should be considered in a descriptive sense only and not for purposes of limitation. Therefore, the scope of the inventive concept is defined not strictly limited to the illustrated embodiments but instead is defined by the appended claims.

What is claimed is:

1. A power management method for a memory device including a first memory die and a second memory die, the method comprising:

receiving a first command with first address indicating a first high power operation ($1^{st}$ HPOp) to be executed in the first memory die, and immediately executing the $1^{st}$ HPOp in the first memory die;

after receipt of the first command, receiving a second command with a second address indicating a second high power operation ($2^{nd}$ HPOp) to be executed in the second memory die, such that an immediate execution of the $2^{nd}$ HPOp would overlap execution of the $1^{st}$ HPOp; and delaying execution of the $2^{nd}$ HPOp through a first waiting period that ends upon completion of the $1^{st}$ HPOp while applying a reference voltage to a second word line of the second memory die indicated by the second address.

2. The method of claim 1, further comprising:

during the first waiting period, the second memory die operates in a memory die condition preparation period during which the second memory die changes a memory die condition in preparation for execution of the second high power operation following the first waiting period.

3. The method of claim 2, wherein the memory die condition is a word line voltage level, and changing the memory die condition comprises:

increasing the voltage level of the second word line from that of the reference voltage to that of a control voltage.

4. The method of claim 2, wherein the memory die condition preparation period has a shorter duration than the first waiting period.

5. The method of claim 3, wherein the memory device is a flash memory device, the second memory die is a second flash memory die, and the second high power operation is a program operation.

6. The method of claim 5, wherein the reference voltage is greater than or equal to a non-selection word line voltage applied to non-selected word lines during the program operation.

7. The method of claim 6, wherein the control voltage is used to program bit lines of the second memory die or verify the bit lines of the second memory die.

8. The method of claim 5, wherein the reference voltage is less than or equal to the control voltage.

9. The method of claim 5, wherein the memory device is a flash memory device, the second memory die is a second flash memory die, and the second high power operation is a read operation.

10. A power management method for a memory system including a memory controller and a memory device, the memory device including a first memory die and a second memory die, the method comprising:

communicating from the memory controller a first command with first address indicating a first high power operation ($1^{st}$ HPOp) to be executed in the first memory die, and immediately executing the $1^{st}$ HPOp in the first memory die;

after receipt of the first command, communicating from the memory controller a second command with a second address indicating a second high power operation ($2^{nd}$ HPOp) to be executed in the second memory die, such that an immediate execution of the $2^{nd}$ HPOp would overlap execution of the $1^{st}$ HPOp; and delaying execution of the $2^{nd}$ HPOp through a first waiting period that ends upon completion of the $1^{st}$ HPOp while applying a reference voltage to a second word line of the second memory die indicated by the second address, wherein the first command and the second command respectively include a peak control signal that enables the first memory die in relation to execution of a high power operation and disables the second memory die in relation to execution of a high power operation during the first waiting period.

11. The method of claim 10, further comprising:

during the first waiting period, the second memory die operates in a memory die condition preparation period during which the second memory die increases a voltage level of a second word line indicated by the second address from that of a reference voltage to that of a control voltage associated with the second high power operation.

12. The method of claim 11, wherein the memory device is a flash memory device, the second memory die is a second flash memory die, and the second high power operation is a program operation.

13. The method of claim 12, wherein the reference voltage is greater than or equal to a non-selection word line voltage applied to non-selected word lines during the program operation.

14. The method of claim 13, wherein the control voltage is used to program bit lines of the second memory die or verify the bit lines of the second memory die.

15. The method of claim 12, wherein the reference voltage is less than or equal to the control voltage.

16. A power management method for a memory system including a memory controller and a memory device, the memory device including a first memory die and a second memory die, the method comprising:

communicating from the memory controller a first command with first address indicating a first high power operation ($1^{st}$ HPOp) to be executed in the first memory die, and immediately executing the $1^{st}$ HPOp in the first memory die;

after receipt of the first command, communicating from the memory controller a second command with a second address indicating a second high power operation ($2^{nd}$ HPOp) to be executed in the second memory die, such that an immediate execution of the $2^{nd}$ HPOp would overlap execution of the $1^{st}$ HPOp; and delaying execution of the $2^{nd}$ HPOp through a first waiting period that ends upon completion of the $1^{st}$ HPOp while applying a conditioning voltage to a second word line of the second memory die indicated by the second address.

17. The method of claim 16, wherein the applied conditioning voltage is defined by a selection signal provided by the memory controller.

18. The method of claim 16, wherein the conditioning voltage is one of a reference voltage and a control voltage used during the $2^{nd}$ HPOp.

19. The method of claim 18, wherein the reference voltage is less than the control voltage.

20. The method of claim 19, wherein the reference voltage is greater than or equal to a non-selection word line voltage applied to non-selected word lines during the $2^{nd}$ HPOp.

* * * * *